(12) United States Patent
Hudson

(10) Patent No.: US 8,635,971 B2
(45) Date of Patent: Jan. 28, 2014

(54) TUNABLE UNIFORMITY IN A PLASMA PROCESSING SYSTEM

(75) Inventor: Eric Hudson, Berkeley, CA (US)

(73) Assignee: Lam Research Corporation, Fremont, CA (US)

(*) Notice: Subject to any disclaimer, the term of this patent is extended or adjusted under 35 U.S.C. 154(b) by 1777 days.

(21) Appl. No.: 11/393,753

(22) Filed: Mar. 31, 2006

(65) Prior Publication Data

US 2007/0235660 A1   Oct. 11, 2007

(51) Int. Cl.
 *C23C 16/00* (2006.01)
 *C23F 1/00* (2006.01)
 *H01L 21/306* (2006.01)
 *H05H 1/00* (2006.01)

(52) U.S. Cl.
 USPC ............ 118/723 R; 156/345.38; 427/572; 216/67

(58) Field of Classification Search
 USPC .................................. 156/345.38; 118/722
 See application file for complete search history.

(56) References Cited

U.S. PATENT DOCUMENTS

| | | | |
|---|---|---|---|
| 4,664,769 A * | 5/1987 | Cuomo et al. | 204/192.1 |
| 5,998,932 A | 12/1999 | Lenz | |
| 6,090,304 A | 7/2000 | Zhu et al. | |
| 6,095,084 A * | 8/2000 | Shamouilian et al. | 118/723 E |
| 6,461,692 B2 | 10/2002 | Fujii et al. | |
| 6,508,913 B2 | 1/2003 | McMillin et al. | |
| 6,596,343 B1 | 7/2003 | Pokharna et al. | |
| 6,627,560 B1 | 9/2003 | Miyano et al. | |
| 6,824,627 B2 | 11/2004 | Dhindsa et al. | |
| 6,998,785 B1 * | 2/2006 | Silfvast et al. | 315/111.71 |
| 2001/0032781 A1 | 10/2001 | Fujii et al. | |
| 2004/0035529 A1 | 2/2004 | Grimbergen | |
| 2004/0125360 A1 * | 7/2004 | Ludviksson et al. | 356/72 |

FOREIGN PATENT DOCUMENTS

WO    WO 03/030237    4/2003

OTHER PUBLICATIONS

Resonance Ltd. RF Powered Continuum Sources. www.resonance.on.ca/Continuum.html Cached version from Feb. 9, 2005. Obtained using http://web.archive.org on Jun. 22, 2009.*
Kim, H.C. et al., "Dual-frequency capacitive discharges: Effect of low-frequency current on electron distribution function", Physics of Plasmas, vol. 12, 053501, 2005 American Institute of Physics, pp. 053501-1-053501-10.

* cited by examiner

*Primary Examiner* — Maureen Gramaglia
(74) *Attorney, Agent, or Firm* — Buchanan Ingersoll & Rooney PC

(57) ABSTRACT

A method of tuning the uniformity of a plasma with a large sheath potential by locally affecting the density of a plasma is provided. The method comprises illuminating a body exposed to the plasma with electromagnetic radiation from a source, wherein the body and the source are cooperatively configured such that the body will generate photoelectrons upon exposure to the radiation from the source. An example of such electromagnetic radiation is vacuum ultraviolet light, and an example of such a body is the edge ring surrounding a semiconductor substrate. Photoelectrons emitted from the edge ring, captured by the plasma, and accelerated into the plasma with sufficient energy to cause ionization, locally increase plasma density. The source of radiation can be a plurality of discrete sources or one or more extended sources. The source can be arranged to provide substantively uniform illumination, or can illuminate according to a non-uniform intensity distribution to compensate for existing non-uniformities in the plasma density or in the plasma process. Such sources can be embedded in the inner or outer electrode part of a multi-piece showerhead electrode assembly, or elsewhere in the chamber.

19 Claims, 4 Drawing Sheets

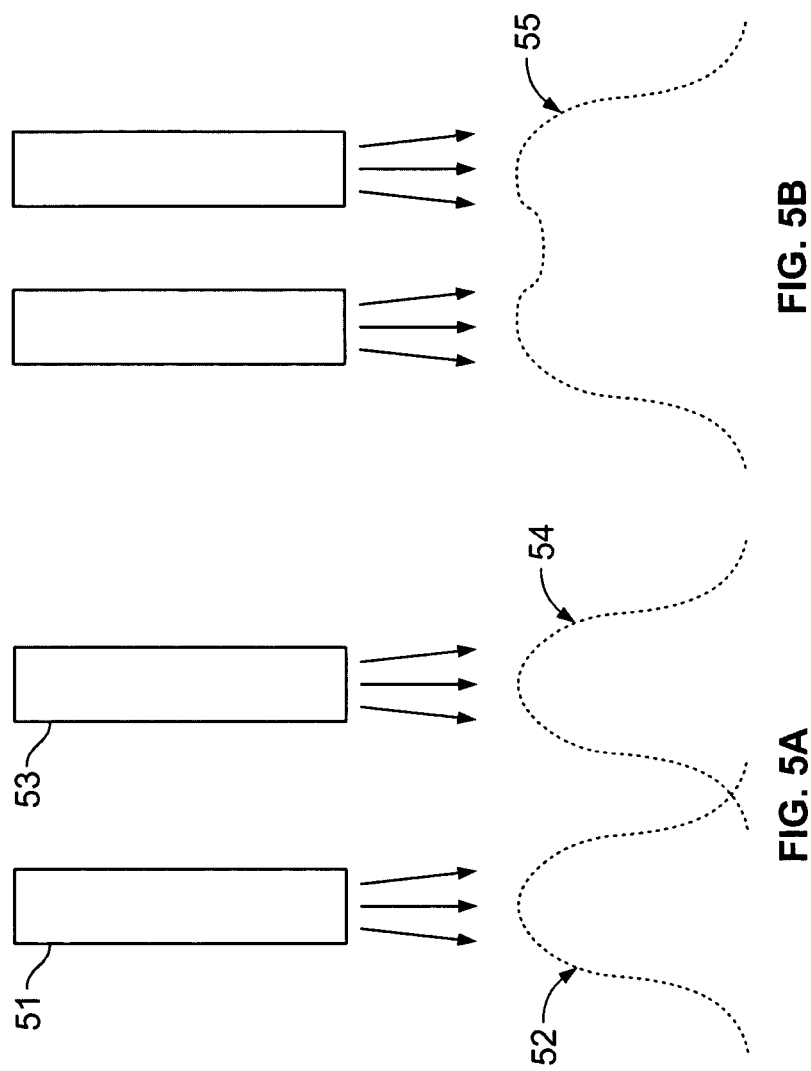

TUNABLE UNIFORMITY IN A PLASMA PROCESSING SYSTEM

BACKGROUND

With each successive semiconductor technology generation, wafer diameters tend to increase and transistor sizes decrease, resulting in the need for an ever higher degree of accuracy and repeatability in wafer processes. Semiconductor substrate materials, such as silicon wafers, are processed by techniques which include the use of vacuum chambers. These techniques include non plasma applications such as sputter deposition, as well as plasma applications, such as plasma-enhanced chemical vapor deposition (PECVD), resist strip, and plasma etch.

Plasma processing systems available today are among those semiconductor fabrication tools which are subject to an increasing need for improved accuracy and repeatability. An important success metric for plasma processing systems is increased uniformity, which includes uniformity of process results on a semiconductor substrate surface as well as uniformity of process results of a succession of wafers processed with nominally the same input parameters. Continuous improvement of on-wafer uniformity is desirable. Among other things, this calls for plasma chambers with improved uniformity, consistency and self diagnostics.

SUMMARY

A method of tuning plasma uniformity by locally affecting the density of the plasma is provided. The method comprises illuminating a body exposed to the plasma with electromagnetic (EM) radiation from a source. The body and the source of EM radiation are cooperatively configured such that the body will generate photoelectrons upon exposure to the radiation from the source. An example of a body which can be so illuminated is the edge ring surrounding a semiconductor substrate. A silicon edge ring will emit photoelectrons as a result of the illumination. Emitted photoelectrons captured by the plasma can be accelerated into the plasma with sufficient energy to cause ionization, and locally increase plasma density.

One source of EM radiation is a vacuum ultraviolet (VUV) light source. VUV light sources can be generated by a radio frequency (RF) powered Ar, Kr, or Xe line or continuous type source, which have wavelengths of from about 10 nm to about 200 nm. Alternatively, the EM radiation source may be an x-ray source such as metal anode source. Optionally, a plurality of EM radiation sources is used to generate the EM radiation. For example, if individual, parallel illumination sources are used, the sources can be arranged to produce substantively uniform illumination around an edge ring. Alternatively, at least one extended EM radiation source can be used. Such sources can be embedded in the inner or outer electrode part of a multi-piece showerhead electrode assembly, or elsewhere in the chamber configured to illuminate a body operating cooperatively with the illumination source. A preferred illuminated body has a work function less than the energy of the illuminating photons.

Increasing plasma density by way of photoelectron generation can be achieved in any plasma processing system which operates with a large sheath potential. This includes capacitively coupled plasma processing systems, as well as plasma systems which include capacitive RF biasing of the substrate such as inductively coupled systems and ECR systems which include capacitive RF biasing. Illumination can occur during the processing of a substrate to effect a process uniformity change. Different amounts of uniformity change can be achieved by reducing or increasing the time of illumination or by reducing or increasing the intensity of any or all of the illumination sources.

BRIEF DESCRIPTION OF THE DRAWINGS

FIG. 5a shows the generation of non-uniform illumination from discrete sources.

FIG. 5b shows an example of the generation of substantively uniform illumination from discrete sources.

DETAILED DESCRIPTION

Figure 1:
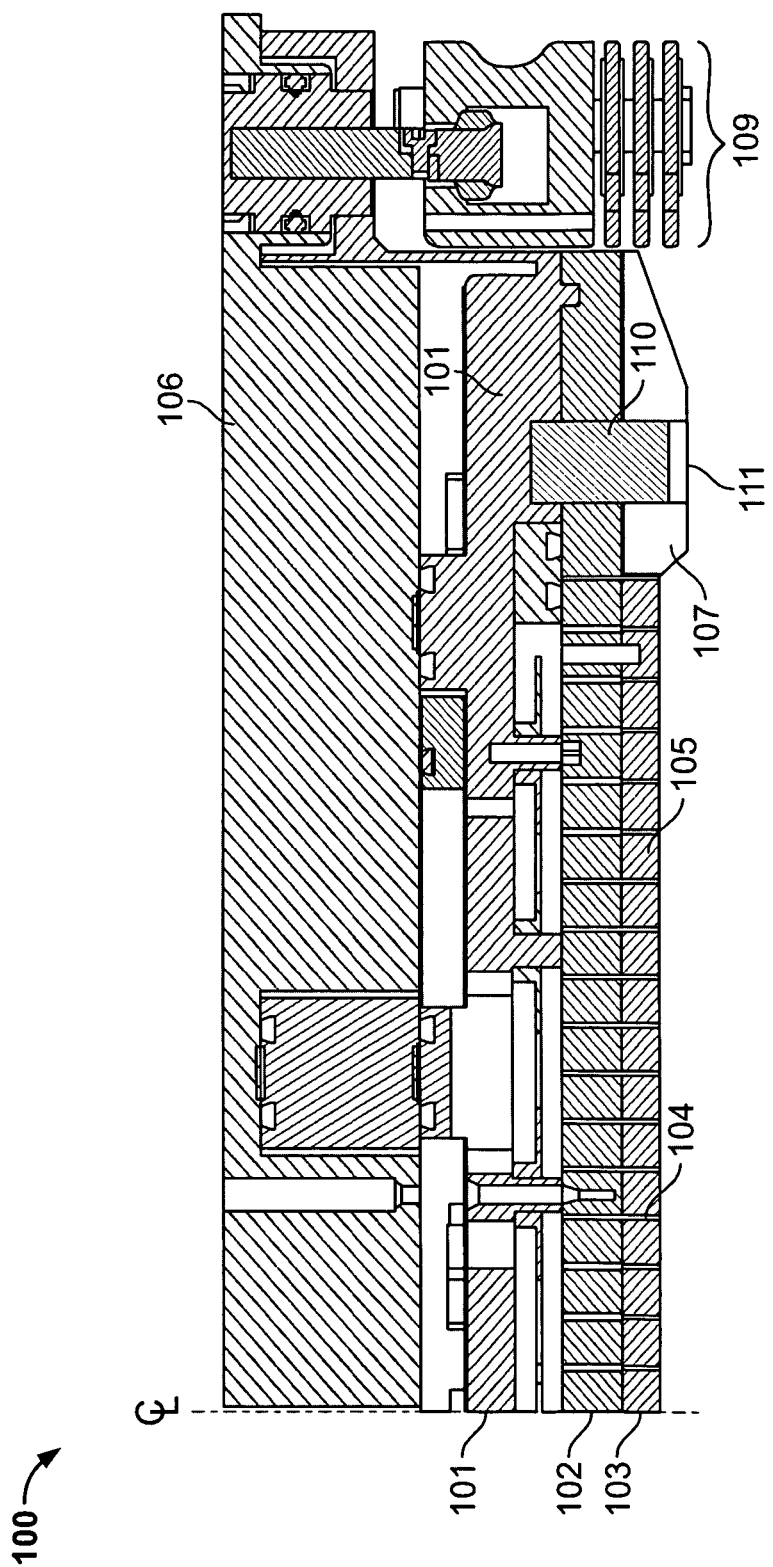
FIG. 1 shows an embodiment of a VUV light source disposed in an outer electrode of a plasma processing chamber.

During plasma processing such as plasma etching, semiconductor substrates such as silicon wafers are processed in a plasma processing apparatus that includes a plasma processing chamber, a gas source that supplies process gas into the chamber, and an energy source that produces a plasma from the process gas. A given sequence of steps and input parameter settings for processing a substrate (e.g. RF power, gas flows, start times, etc.) can be referred to as a given "plasma process".

Outputs of plasma processes include uniformity, which often refers to uniformity of the rate of the process across the substrate compared to the average rate across the substrate. For example, if an etch rate is measured at a plurality of points across the wafer by measuring the amount etched at each point and dividing by the etch time, one measure of uniformity is the standard deviation of the rates of the plurality of points. This measure of uniformity could be used for deposition rates, as well.

Uniformity is generally categorized into two types. One type of non-uniformity is azimuthally symmetric or radial, e.g. the rate near the center is low compared to the rate near the edges, or vice versa. A second type of non-uniformity can be azimuthally asymmetric or non-radial. An example of non-radial non-uniformity is a slower or faster than average rate on one half of the substrate surface. Non-radial non-uniformity often occurs near a wafer edge.

Sometimes, control over uniformity can be achieved by making adjustments to the process wherein the adjustments have unintentional and often undesirable effects on other aspects of the process. For example, a decrease in plasma density may simultaneously increase etch rate uniformity and decrease average etch rate. In this example, the increase in uniformity is desirable and the decrease in etch rate is not. It is therefore preferable to have the capability of independently changing uniformity without substantively affecting other process outputs. Examples of process outputs include etch rate, critical dimension (CD), mask selectivity, and feature profile angle. Such a capability may be called uniformity tuning.

An example of uniformity tuning is the use of zoned gas introduction. Zoned gas introduction, available, for example, on the Exelan™ etch processing system from Lam Research Corporation, (Fremont, Calif.), involves adjusting the flow rates of gasses used to feed the plasma in such a way as to change the relative ratio of gas flows directed to the center of a circular substrate to gas flows directed toward the edge of the substrate. This method can be used to improve radial non-uniformity, and has greatest effect in cases where process non-uniformity is primarily a result of non-uniformity in plasma chemistry, i.e. variations in the concentration of neutral reactive species.

However, some cases of process non-uniformity are driven by non-uniform distribution of the plasma density, i.e. variations in the concentration of charged species. In many of these cases, the non-uniformity appears as a lower etch rate near the edge of the wafer. Non-uniformity due to non-uniform plasma density can be affected by selectively increasing the plasma density (electron density or positive ion density) near the wafer edge.

In a preferred embodiment, a method for increasing plasma density near the edge of a semiconductor substrate in a plasma processing system comprises directing a beam of ionizing radiation at the surface of the substrate near the substrate edge, or at a nearby surface such as the exposed upper surface of an edge ring, resulting in the production of photoelectrons. Electrons generated in this manner are then accelerated through the sheath potential of the plasma, sending a high-energy beam of electrons into the plasma. With sufficient potential, these accelerated electrons acquire enough energy to induce ionization and thus increase the plasma density in the vicinity of the affected surface. The plasma processing system therefore preferably operates with a large sheath voltage of at least about 100 V, and more preferably at least about 500 V. Examples of plasma systems which have large sheath voltages during operation include capacitively coupled plasma systems and plasma systems which include capacitive RF biasing of the substrate such as inductively coupled systems and ECR systems which include capacitive RF biasing.

The ionizing radiation source may be a source of vacuum ultraviolet (VUV) radiation, such as that which is produced by an atomic emission discharge lamp. Vacuum ultraviolet radiation refers to electromagnetic radiation with a wavelength of from 10 nm to 200 nm. The onset of VUV, 200 nm, is so defined because atmospheric air is opaque below this wavelength due to the strong absorption of light of these wavelengths by oxygen. Alternatively, the radiation source may be an x-ray source such as metal anode source.

In a preferred embodiment, the sheath potential is created and maintained by the at least one RF generator used as the primary energy source for producing the plasma environment. The VUV light source is preferably required only to provide sufficient power to produce a flux of photoelectrons at the generating surface sufficient to control plasma uniformity. VUV generated photoelectrons are accelerated by the sheath potential, which may range from hundreds to several thousand volts. The photoelectrons therefore draw most of their energy from the RF-induced fields, resulting in low power requirements for the VUV light source.

In a preferred embodiment, an arrangement of sealed VUV discharge lamps are disposed in a plasma etch reactor. An exemplary embodiment of a VUV lamp disposed within an etch reactor is schematically depicted in FIG. 1. FIG. 1 shows one-half of a showerhead assembly 100 of a parallel plate capacitively coupled plasma chamber such as the Exelan 2300™, available from Lam Research Corporation, Fremont, Calif. The showerhead comprises a top electrode 103 and an optional backing member 102 secured to the top electrode 103, a thermal control plate 101, and a top plate 106. The top plate 106 can form a removable top wall of the plasma processing apparatus, such as a plasma etch chamber. The top electrode 103 includes an inner electrode member 105, and an optional outer electrode member 107 which forms a step in the exposed lower surface of the electrode 103. The inner electrode member 105 is preferably made of single crystal silicon. The inner and outer electrodes 105, 107 can optionally be made of a single piece of material such as CVD silicon carbide, single crystal silicon or other suitable material.

The outer electrode member 107 can be a continuous member (e.g., a poly-silicon or silicon carbide member) such as a ring, or a segmented member (e.g., 2-6 separate segments arranged in a ring configuration), such as segments of single crystal silicon. In embodiments wherein the top electrode 103 includes a multiple-segment outer electrode member 107, the segments preferably have edges which overlap each other to protect an underlying bonding material from exposure to plasma.

In accordance with a preferred embodiment, each of a distributed arrangement of VUV lamps is embedded in outer electrode member 107 and extends into thermal control plate 101. A single exemplary lamp 110 with window 111 is shown. The lamps may be distributed uniformly or non-uniformly around the outer electrode. In order to establish the electrical circuit necessary to operate the lamps, electrical connections to the lamps 110 preferably traverses the chamber containment, from inside the chamber to outside the chamber, through a wall, window, vacuum feed-through or connector (not shown).

A plasma confinement ring assembly 109 is shown surrounding the outer electrode. Further details of a plasma confinement ring assembly can be found in commonly-owned U.S. Pat. No. 5,998,932, the disclosure of which is hereby incorporated by reference. The inner electrode member 105 preferably includes multiple gas passages 104 for injecting a process gas into a space in a plasma reaction chamber below the top electrode 103. The outer electrode 107 preferably forms a protruding step at the periphery of the electrode 103. Further details of a stepped electrode can be found in commonly-owned U.S. Pat. No. 6,824,627, the disclosure of which is hereby incorporated by reference.

Figure 2:
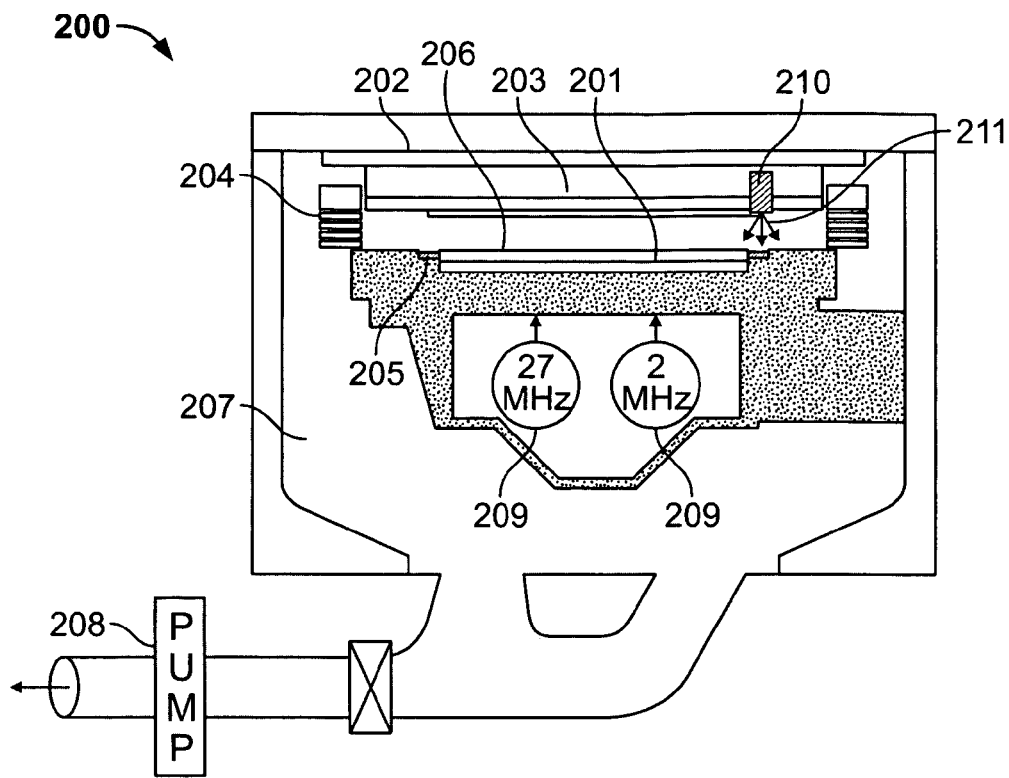
FIG. 2 shows an exemplary plasma process chamber of the present embodiment.

An exemplary simplified schematic of the Exelan 2300™ parallel plate process chamber in accordance with a preferred embodiment is shown in FIG. 2. The system 200 includes a chamber having an interior 207 maintained at a desired vacuum pressure by a vacuum pump 208 connected to an outlet in the bottom of the reactor. Etching gas can be supplied to the showerhead electrode assembly from a dual gas feed (not shown). Further details of a dual gas feed arrangement can be found in commonly-owned U.S. Pat. No. 6,508,913, the disclosure of which is hereby incorporated by reference. A medium density plasma can be generated in the reactor by a dual frequency arrangement wherein RF energy from RF sources 209 is supplied through a matching network (not shown) to a powered lower electrode 201. The RF sources 209 are shown configured to supply RF power at 27 MHz and 2 MHz. However, any suitable electrode arrangement can be used with a single or multiple RF source with suitable RF frequency or frequencies. Plasma confinement is assisted by confinement rings 204. The upper electrode 203 is connected to a temperature controlled top plate 202, and is a grounded electrode. A substrate (not shown) is supported by an electrostatic chuck (ESC) 206, which is surrounded by edge ring 205. In accordance with the present embodiment, an arrangement of VUV lamps is embedded in upper electrode 203. A single exemplary lamp 210 is shown emitting UV light 211 on edge ring 205. While only a single lamp is shown, it will be understood that a plurality of lamps can be used, such as a series of lamps spaced in a distributed fashion around the outer electrode.

Figure 3:
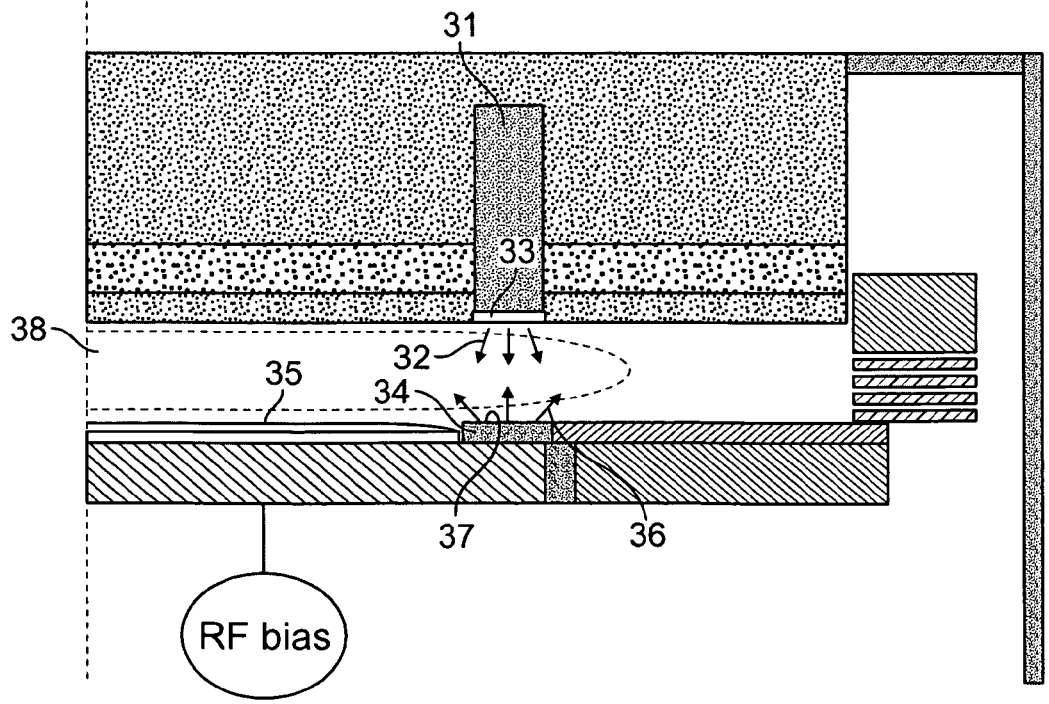
FIG. 3 shows a detailed exemplary embodiment of a VUV light source disposed within a plasma processing chamber

A closer view of a VUV source embedded within the upper electrode of a plasma etch reactor is shown in FIG. 3. In a preferred embodiment, an arrangement of VUV light sources emit light on edge ring 34. A single exemplary VUV source 31 is shown emitting ionizing VUV light 32 through window 33 primarily directed toward silicon edge ring 34. It is understood that a plurality of sources can be used. The edge ring has a work function of less than the energy of the VUV photons. Photoelectrons 36 generated from edge ring 34 exit from upper surface 37 in the vicinity of plasma region 38. A substrate 35 is present surrounded by the edge ring 34, and may also be exposed to VUV light. If substrate 35 has a work function less than the energy of the VUV photons, exposure to VUV light will also result in the generation of photoelectrons from the substrate surface, which may also be captured by the plasma.

Window 33 preferably serves to isolate the lamp discharge generated by the VUV source from the chamber plasma, and is RF-isolating to prevent RF power coupling between the lamp and the processing plasma. Window 33 is also preferably substantively transparent in the wavelengths of interest and serves to isolate any gasses used in the lamp. Suitable window materials include magnesium fluoride ($MgF_2$).

Electropositive plasmas form sheaths of low electron density, also called "dark spaces", near solid surfaces. The sheath layer of a capacitive plasma varies during the RF cycle, and as indicated above, can have peak values of several hundred to several thousand volts. Sheath layer potentials are positive toward the plasma, and so act to accelerate photoelectrons away from the surface and toward the plasma. Photoelectrons generated from the edge ring or the substrate can thus be captured by and accelerated toward the plasma. Once photoelectrons have built up enough energy, they are capable of ionizing atomic and/or molecular species upon collision. The ionization process results in a positively charged ion and an electron, thus increasing the plasma density in that region.

Figure 4:
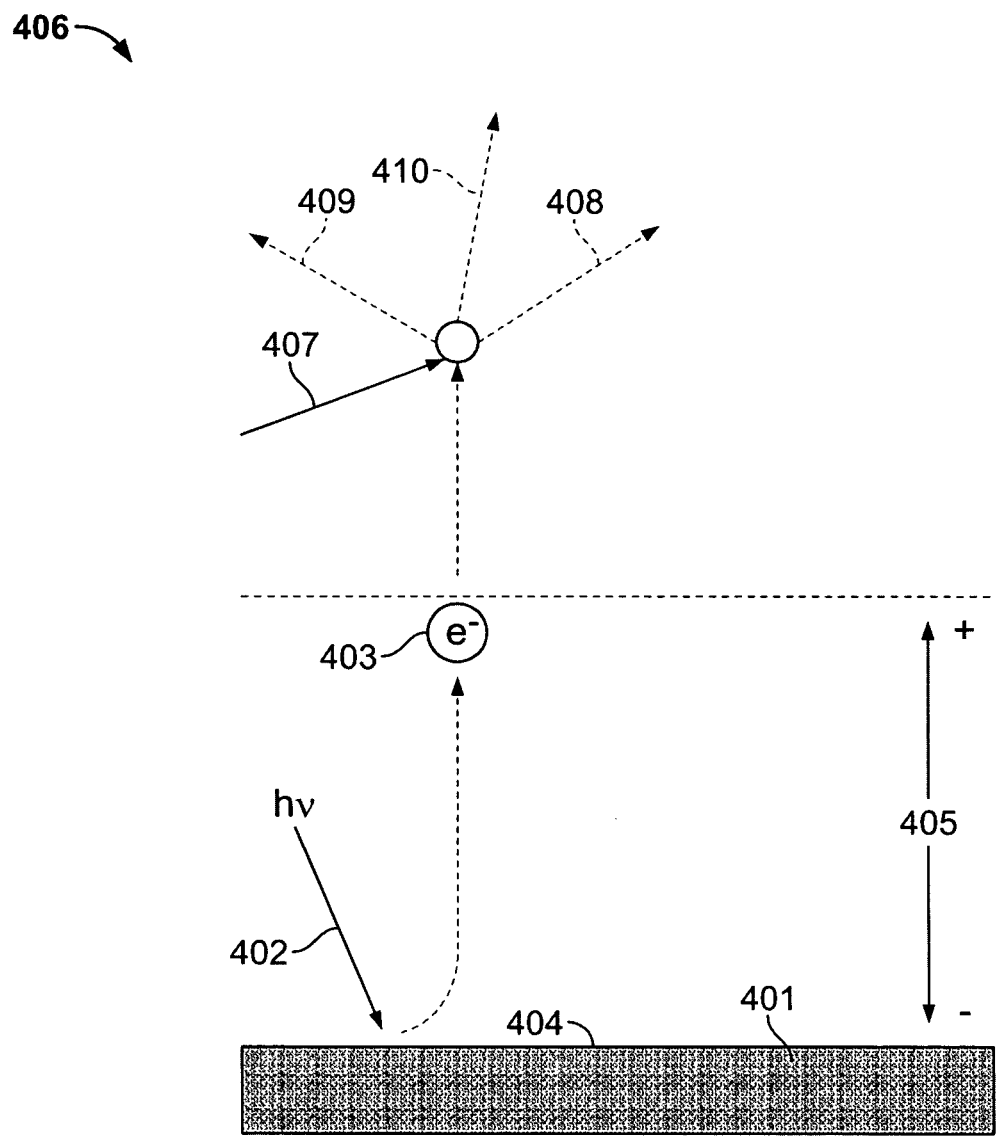
FIG. 4 shows the generation of a photoelectron, and its subsequent acceleration through plasma sheath into the neutral region of the plasma where it then collides with a neutral species, producing a positively charged ion and an additional electron.

This process is schematically illustrated in FIG. 4, which shows Si edge ring 401 being struck by incoming VUV photon 402. Photoelectron 403 is generated from upper surface 404, and is accelerated through plasma sheath 405 into the neutral region of the plasma 406. Photoelectron 403 then collides with neutral species 407, and the collision generates a positively charged ion 408 and electron 409, in addition to the original incident electron 410. Plasma density in region 406 is thereby increased.

The wavelength of the VUV light is chosen such that the photon energy exceeds the work function of the silicon surface. For the typical ~4.9 eV work function of silicon, this converts to a requirement that the wavelength be <253 nm. Preferably, the chosen wavelength is less than 253 nm by an amount such that the VUV light energy is above the minimum energy required theoretically, in case the work function of the silicon edge ring is higher than the theoretical value due, for example, to variable surface conditions. A preferred VUV wavelength is therefore less than about 175 nm, and more preferably below about 150 nm.

Example Calculation: An order of magnitude calculation can help determine the preferred intensity of the VUV light source. One mechanism of electron generation is ion-induced surface emission of secondary electrons. It has been reported that this type of electron generation, and the subsequent acceleration of the electrons through the sheath, have a notable effect upon the plasma density of capacitively coupled discharges. Ion-induced secondary electrons are reportedly produced at a rate of roughly 0.2 electrons/ion. For example, see H. C. Kim and J. K. Lee, Physics of Plasmas, v. 12, p. 53,501 (2005), the disclosure of which is hereby incorporated by reference in its entirety.

Not wishing to be bound by theory, it can be hypothesized that a desirable range of photoelectron flux is from 10% to 30% of the ion flux impinging on the surface. A plasma processing system running at fairly high power has a typical ion flux of ~1 $mA/cm^2$, or $6 \times 10^{15}$ ions/(sec $cm^2$), resulting in an electron production of $1.2 \times 10^{15}$ electrons/(sec $cm^2$), and providing a target intensity for the VUV source. Thus assuming a yield of ~0.1 photoelectrons/photon, an estimated preferred photon flux is from $6 \times 10^{15}$ to $1.8 \times 10^{16}$ photons/(sec $cm^2$), which, for 147 nm photons, is 8 to 24 $mW/cm^2$. Commercially available Xe discharge lamps provide 147 nm light at an output power of about 5 mW over a 0.6 $cm^2$ spot located 2 cm from the window. An example of such a Xe lamp is the XeLM-L, an RF powered ~12 mW/steradian line source with emission at 147 nm, available from Resonance, Ltd., Barrie, Ontario. This power output corresponds to a VUV power density of ~8 $mW/cm^2$. If desired, more intense light sources can be used. Alternative sources include the KrCM-L Krypton continuum source, an RF powered ~3 mw/steradian source with a continuous emission in the range of 124 to 170 nm, also from Resonance, Ltd.

In alternative embodiments, at least one EM radiation source capable of emitting ionizing radiation is disposed in other plasma reactors. Reactors may include, but are not limited to plasma system etch systems such as the Exelan™ HPT series, the 2300 Exelan™, and the 2300 Exelan™ Flex™, available from Lam Research Corporation. Embodiments include the use of an EM radiation source in plasma deposition system and any plasma system which operates with a sheath voltage of greater than 100 V. This includes capacitively coupled reactors where RF power may be supplied to both electrodes. An example is the dual frequency plasma etch reactor described in commonly owned U.S. Pat. No. 6,090,304, the disclosure of which is hereby incorporated by reference.

Although certain embodiments have been discussed in conjunction with capacitively coupled plasma processing chambers, the additional embodiments may also apply to inductively-coupled plasma processing chambers (such as Transformer Coupled Plasma or TCP™ plasma processing chambers from Lam Research Corporation) or electron cyclotron resonance (ECR) plasma processing chambers, which also includes capacitive RF biasing of the substrate, generally resulting in the formation of a large sheath voltage during operation.

While the foregoing FIG. 1 shows a VUV light source incorporated in an outer electrode, EM radiation sources could be incorporated in other chamber parts, such as an inner electrode, a top electrode, an upper backing plate, an electrode without gas outlets, a gas distribution plate, or anywhere in the chamber adjacent an opposing body from which the generation of photoelectrons may be desirable.

In a preferred embodiment, EM radiation sources are disposed at discrete locations around the outer electrode such that the exposed upper surface of the edge ring is illuminated with ionizing radiation in overlapping zones thereof. It will be appreciated by those skilled in the art, that depending on the spacing of the EM radiation sources, and to the extent to which the EM radiation intensity falls off as a function of lateral distance form the source, an arrangement of sources is configurable to generate a substantively uniform illumination around the edge ring, resulting in a substantively uniform generation of photoelectron emission. The number of sources is preferably such that when evenly spaced, the separation between sources of diameter D is between 0.01 D and 1.0 D. A preferred diameter of the discrete sources is between 0.1 inch and 1 inch. For example, if the sources are placed in an outer electrode at a radius of 7 inches, the sources have a diameter of 0.5 inches, and the spacing between sources is 0.05 inches, about 80 sources could be used. However, with use of lenses or other optical shaping devices, re-spacing can be effected to achieve the desired results.

An example of the generation of illumination from discrete sources is shown schematically in FIG. 5a and FIG. 5b. FIG. 5a shows a first individual light source 51 resulting in a first illumination zone with intensity distribution 52, situated adjacent to a second, similar light source 53, which produces a second illumination zone with intensity distribution 54. When the light sources are brought within proximity of each other, as shown in FIG. 5b, the intensity illumination distributions overlap, generating a combination intensity distribution 55. Distribution 55 shows a more uniform intensity profile than individual profiles 52 and 54. Illumination intensity distribution can also be affected with configuration changes to the light source. For example, a short adapter for wide angle output, or a lens assembly could be used to broaden or narrow the intensity distribution, as desired.

In alternative embodiments, a single, extended EM radiation source which distributes a uniform illumination intensity along a ring or segmented ring shape could also be used. Other geometries having a configuration adapted to irradiate an exposed surface of a compatible body cooperatively configured to emit photoelectrons can also be used.

Although a photoelectron intensity distribution around an edge ring surrounding a substrate may not be uniform, some averaging may occur within the plasma due to the dynamics of the plasma system. A preferred illumination intensity around the edge ring is within the range of 20% above and 20% below the average intensity around the edge ring. That is, at no azimuthal angle is the illuminating intensity greater than 20% more than the average intensity or less than 20% less than the average intensity around the edge ring. A more preferred illumination intensity is within the range of 10% above and 10% below the average intensity around the edge ring.

In alternative embodiments, a preferred illumination intensity distribution is a non-uniform distribution. If desired, a non-uniform intensity distribution may be used in order, for example, to compensate for existing non-uniformities present in the plasma density or in the plasma process. Azimuthal plasma density non-uniformities can be at least partially compensated with an arrangement of EM radiation sources disposed at discrete locations around the outer electrode such that the edge ring is illuminated unevenly with EM radiation. Alternatively, EM radiation sources are disposed at discrete locations evenly around the outer electrode, and the individual intensity of each discrete source is made lower or higher than the intensity of the average of the sources. In additional embodiments, the time in which a source is powered can be adjusted. For example, individual selected sources may be powered for a duration less than the duration for which other sources are powered.

Preferred embodiments include the use of any illuminating source which irradiates photons of energy greater than the work function of the cooperating opposing body upon which the illumination is incident. Thus, illuminating sources and cooperating receiving bodies alternative to those indicated above may be selected. For example, aluminum has a reported work function of 4.3 eV, about 0.6 eV less than the work function of silicon. A lower work function may allow a lower energy light source to be used, or may be desirable for other reasons, such as a desire to use a different material for the opposing body. It will therefore be appreciated by those skilled in the art that a preferred system comprises any combination of illuminating source and cooperating body in which the cooperating body emits photoelectrons when exposed to the illumination of the illuminating source.

While the invention has been described in detail with reference to specific embodiments thereof, it will be apparent to those skilled in the art that various changes and modifications can be made, and equivalents employed, without departing from the scope of the appended claims.

What is claimed is:

1. A plasma processing chamber capable of tuning the uniformity of a plasma by affecting a local density of the plasma; comprising,
   at least one electromagnetic radiation source and an edge ring having a plasma exposed surface;
   wherein radiation of the radiation source is directed onto the plasma exposed surface and the edge ring generates photoelectrons emitting from the plasma exposed surface into the plasma;
   wherein the local density of the plasma is affected by acceleration of the photoelectrons into the plasma with sufficient energy to cause local ionization of the plasma;
   wherein the electromagnetic radiation compensates for existing non-uniformities in the plasma density or in the plasma process;
   wherein the at least one electromagnetic radiation source comprises a series of evenly spaced radiation sources arranged to provide uniform illumination around the edge ring embedded in the inner or outer electrode part of a multi-piece showerhead electrode assembly.

2. The chamber of claim 1, wherein the at least one electromagnetic radiation source comprises a plurality of evenly spaced vacuum ultraviolet lamps.

3. The chamber of claim 2, wherein the plurality of vacuum ultraviolet lamps is arranged such that the separation between the radiation sources each of diameter D is between 0.01 D and 1.0 D and the upper surface of the edge ring is illuminated with ionizing radiation in overlapping zones.

4. The chamber of claim 2, wherein the chamber is a plasma etch chamber.

5. The chamber of claim 2, wherein each of the radiation sources is adapted to provide illumination intensity higher or lower than an average illumination intensity of the radiation sources.

6. The chamber of claim 2, wherein each of the radiation sources is adapted to provide illumination intensity for an adjustable time period which is less than a duration that other radiation sources are powered.

7. The chamber of claim 1, wherein the edge ring is a single or multi-piece edge ring surrounding a single semiconductor substrate, the edge ring comprising a semiconductor material or a ceramic.

8. The chamber of claim 1, wherein the at least one electromagnetic radiation source comprises an RF powered Ar, Kr, or Xe, line-type or continuum-type vacuum ultraviolet lamp, wherein light emitted from the vacuum ultraviolet lamp has a wavelength of from about 10 nm to about 200 nm and is capable of supplying an output intensity of at least about $1.2 \times 10^{15}$ photons/(sec cm$^2$).

9. The chamber of claim 1, wherein the at least one electromagnetic radiation source is an x-ray source.

10. The chamber of claim 1, wherein the chamber is any of a capacitively coupled plasma processing chamber, an inductively-coupled plasma processing chamber and an electron cyclotron resonance plasma processing chamber.

11. A method of using the plasma processing chamber of claim 1 for tuning the uniformity of a plasma by locally affecting the density of the plasma, comprising:
   a) supplying a process gas to the plasma chamber;
   b) energizing the process gas so as to generate a plasma in the plasma chamber wherein the edge ring is exposed to the plasma;
   c) illuminating the edge ring exposed to the plasma with electromagnetic radiation from the radiation source so as to generate photoelectrons; wherein
   d) the local density of the plasma is affected by acceleration of the photoelectrons into the plasma with sufficient energy to cause local ionization of the plasma.

12. The method of claim 11, wherein the electromagnetic radiation is vacuum ultraviolet light.

13. The method of claim 11, wherein the electromagnetic radiation is x-ray radiation.

14. The method of claim 11, further comprising processing a semiconductor substrate with a plasma in the plasma chamber.

15. The method of claim 14, wherein the density of the plasma is locally affected in a way so as to provide uniform processing of the semiconductor substrate.

16. The method of claim 14, wherein the semiconductor substrate being processed is being illuminated.

17. The method of claim 14, wherein the semiconductor substrate is processed using a plasma etch process.

18. The method of claim 11, wherein the electromagnetic radiation illuminates according to a non-uniform intensity distribution to compensate for existing non-uniformities in the plasma density or in the plasma process.

19. The method of claim 11, wherein the energy of the electromagnetic radiation is at least 100 eV, or at least 500 eV.

* * * * *